US009835957B2

(12) United States Patent
Houben et al.

(10) Patent No.: US 9,835,957 B2
(45) Date of Patent: Dec. 5, 2017

(54) SUPPORT TABLE FOR A LITHOGRAPHIC APPARATUS, LITHOGRAPHIC APPARATUS AND DEVICE MANUFACTURING METHOD

(71) Applicant: ASML Netherlands B.V., Veldhoven (NL)

(72) Inventors: Martijn Houben, Veldhoven (NL); Alwin De Kock, Veldhoven (NL); Hendrikus Johannes Marinus Van Abeelen, Veldhoven (NL); Marco Adrianus Peter Van Den Heuvel, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/021,240

(22) PCT Filed: Sep. 2, 2014

(86) PCT No.: PCT/EP2014/068575
§ 371 (c)(1),
(2) Date: Mar. 10, 2016

(87) PCT Pub. No.: WO2015/043890
PCT Pub. Date: Apr. 2, 2015

(65) Prior Publication Data
US 2016/0187791 A1    Jun. 30, 2016

Related U.S. Application Data

(60) Provisional application No. 61/883,775, filed on Sep. 27, 2013, provisional application No. 61/912,383, filed on Dec. 5, 2013.

(51) Int. Cl.
*B23B 5/34*     (2006.01)
*B23B 31/28*    (2006.01)
(Continued)

(52) U.S. Cl.
CPC .......... *G03F 7/70716* (2013.01); *G03F 7/707* (2013.01); *G03F 7/70875* (2013.01); *H01L 21/6875* (2013.01)

(58) Field of Classification Search
CPC .. G03F 7/707; G03F 7/70716; G03F 7/70875; G03F 7/70858; H01L 21/677; H01L 21/68; H01L 21/683
(Continued)

(56) References Cited

U.S. PATENT DOCUMENTS

| 4,509,852 A | 4/1985 | Tabarelli et al. |
| 5,583,736 A | 12/1996 | Anderson et al. |

(Continued)

FOREIGN PATENT DOCUMENTS

| CN | 1637610 | 7/2005 |
| CN | 1804725 | 7/2006 |

(Continued)

OTHER PUBLICATIONS

Japanese Office Action dated Mar. 7, 2017 in corresponding Japanese Patent Application No. 2016-518137.
(Continued)

*Primary Examiner* — Colin Kreutzer
(74) *Attorney, Agent, or Firm* — Pillsbury Winthrop Shaw Pittman, LLP

(57) ABSTRACT

A support table to support a surface of a substrate, wherein the support table includes: a base surface substantially parallel to the surface of the substrate, a plurality of burls protruding above the base surface, each of the burls having a respective distal end and a first height above the base surface, the burls arranged such that, when the substrate is supported by the support table, the substrate is supported by the respective distal ends, and a plurality of elongate raised protrusions separated by gaps, each of the elongate raised
(Continued)

protrusions having a second height above the base surface, wherein the elongate raised protrusions protrude above the base surface between the burls, and the second height is less than the first height; wherein the protrusions are arranged such that a plurality of the gaps are aligned to form a straight gas flow path towards an edge of the base surface.

20 Claims, 7 Drawing Sheets

(51) Int. Cl.
*G03B 27/52* (2006.01)
*G03B 27/58* (2006.01)
*G03F 7/20* (2006.01)
*H01L 21/687* (2006.01)

(58) Field of Classification Search
USPC .................. 279/3, 128; 355/30, 53, 72, 77
See application file for complete search history.

(56) References Cited

U.S. PATENT DOCUMENTS

| | | | |
|---|---|---|---|
| 5,761,023 | A | 6/1998 | Lue et al. |
| 7,196,768 | B2 | 3/2007 | Ottens et al. |
| 7,532,310 | B2 | 5/2009 | Mertens et al. |
| 8,502,960 | B2 | 8/2013 | Brinkhof et al. |
| 8,970,822 | B2 | 3/2015 | Kunnen et al. |
| 2002/0002944 | A1 | 1/2002 | Shirley |
| 2004/0207824 | A1 | 10/2004 | Lof et al. |
| 2005/0041364 | A1 | 2/2005 | Kellerman et al. |
| 2006/0033892 | A1 | 2/2006 | Cadee et al. |
| 2006/0038968 | A1 | 2/2006 | Kemper et al. |
| 2006/0087637 | A1 | 4/2006 | Ottens et al. |
| 2006/0096972 | A1 | 5/2006 | Nakamura |
| 2006/0102849 | A1 | 5/2006 | Mertens et al. |
| 2006/0158627 | A1 | 7/2006 | Kemper et al. |
| 2006/0207725 | A1 | 9/2006 | Oohashi et al. |
| 2007/0070315 | A1 | 3/2007 | Jacobs et al. |
| 2007/0247779 | A1 | 10/2007 | Nakamura |
| 2008/0068580 | A1 | 3/2008 | Mori et al. |
| 2008/0111984 | A1 | 5/2008 | Shibuta |
| 2008/0137055 | A1 | 6/2008 | Hennus et al. |
| 2008/0165330 | A1 | 7/2008 | Mizutani |
| 2008/0171131 | A1 | 7/2008 | Moro et al. |
| 2008/0212046 | A1 | 9/2008 | Riepen et al. |
| 2008/0212050 | A1 | 9/2008 | Poon et al. |
| 2009/0233443 | A1 | 9/2009 | Sasaki |
| 2009/0254226 | A1 | 10/2009 | Iwanaga et al. |
| 2009/0279060 | A1 | 11/2009 | Direcks et al. |
| 2009/0279061 | A1 | 11/2009 | Jacobs et al. |
| 2009/0279062 | A1 | 11/2009 | Direcks et al. |
| 2011/0007288 | A1 | 1/2011 | Brinkhof et al. |
| 2011/0128517 | A1 | 6/2011 | Ottens et al. |
| 2011/0181849 | A1 | 7/2011 | Patel et al. |
| 2011/0222032 | A1 | 9/2011 | Ten Kate et al. |
| 2011/0228248 | A1 | 9/2011 | Lafarre et al. |
| 2012/0013865 | A1 | 1/2012 | Laurent et al. |
| 2012/0285619 | A1 | 11/2012 | Matyushkin et al. |
| 2013/0045447 | A1 | 2/2013 | Kunnen et al. |
| 2013/0094005 | A1 | 4/2013 | Kunnen et al. |
| 2015/0277243 | A1 | 10/2015 | Kunnen et al. |

FOREIGN PATENT DOCUMENTS

| | | |
|---|---|---|
| CN | 102067039 | 5/2011 |
| CN | 102955375 | 3/2013 |
| EP | 0 463 853 | 1/1992 |
| EP | 1 420 298 | 5/2004 |
| EP | 1 530 088 | 5/2005 |
| EP | 1 650 604 | 4/2006 |
| EP | 1 843 386 | 10/2007 |
| EP | 1 962 329 | 8/2008 |
| JP | 3-192246 | 8/1991 |
| JP | H05-234843 | 9/1993 |
| JP | H06-069125 | 3/1994 |
| JP | H09-148417 | 6/1997 |
| JP | H09-283608 | 10/1997 |
| JP | 2004-039862 | 2/2004 |
| JP | 2004-511907 | 4/2004 |
| JP | 2005-012009 | 1/2005 |
| JP | 2006-128682 | 5/2006 |
| JP | 2008-172214 | 7/2008 |
| JP | 2008-177303 | 7/2008 |
| JP | 2009-076940 | 4/2009 |
| JP | 2009-266886 | 11/2009 |
| JP | 2010-016176 | 1/2010 |
| JP | 2011-023716 | 2/2011 |
| JP | 2011-151397 | 8/2011 |
| JP | 2013-042127 | 2/2013 |
| JP | 2013-042128 | 2/2013 |
| TW | 200627079 | 8/2006 |
| TW | 200633112 | 9/2006 |
| TW | 200839462 | 10/2008 |
| WO | 99/49504 | 9/1999 |

OTHER PUBLICATIONS

International Search Report and Written Opinion dated Nov. 12, 2014 in corresponding International Patent Application No. PCT/EP2014/068575.
European Office Action dated Jan. 18, 2017 in corresponding European Patent Application No. 14 758 149.0.
Chinese Office Action dated Nov. 15, 2016 in corresponding Chinese Patent Application No. 201480059395.0.
Notice of Allowance issued in corresponding U.S. Appl. No. 15/435,094, dated Apr. 14, 2017.

SUPPORT TABLE FOR A LITHOGRAPHIC APPARATUS, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2014/068575, which was filed on Sep. 2, 2014, which claims the benefit of priority of U.S. provisional application Nos. 61/883,775, which was filed on Sep. 27, 2013, and 61/912,383, which was filed on Dec. 5, 2013, and which are incorporated herein in their entirety by reference.

FIELD

The present invention relates to a support table for a lithographic apparatus, a lithographic apparatus and a method for manufacturing a device using a lithographic apparatus

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

Utilizing immersion fluid in a lithographic apparatus may introduce certain difficulties. For example, the use of immersion fluid may result in an additional heat load within the lithographic apparatus, which may affect the accuracy of formation of an image on a substrate.

In some instances the heat load may be non-uniform across a substrate, resulting in non-uniform variation of the image. By way of example, a heat load may be caused by operation of a fluid handling system and/or by evaporation of the immersion fluid. These effects may be localized to a part of a substrate. Consequently, there may be a localized temperature change in the substrate, resulting in a localized thermal expansion or contraction of the substrate. This is in turn may result in a localized variation in an overlay error and/or critical dimension (CD). A support table may include a conditioning system to condition the temperature of the substrate.

The support table may comprise a plurality of protrusions to increase the thermal coupling between the substrate and the support table. The protrusions can restrict the flow of gas between the substrate and the support table. This can slow down clamping or loading of the substrate onto the support table. This can reduce the throughput of the lithographic apparatus.

It is desirable, for example, to provide a system in which the speed of clamping or loading can be increased and/or in which throughput can be increased.

According to an aspect of the invention, there is provided a support table for a lithographic apparatus, the support table configured to support a lower surface of a substrate, wherein the support table comprises: a base surface configured to be substantially parallel to the lower surface of the substrate supported on the support table, a plurality of burls protruding above the base surface, each of the plurality of burls having a respective distal end and a first height above the base surface, the plurality of burls arranged such that, when the substrate is supported by the support table, the substrate is supported by the respective distal end of each of the plurality of the burls, and a plurality of elongate raised protrusions separated by gaps, each of the plurality of elongate raised protrusions having a second height above the base surface, wherein the plurality of elongate raised protrusions protrude above the base surface between the burls, and the second height is less than the first height; wherein the protrusions are arranged such that a plurality of the gaps are aligned to form at least one straight gas flow path towards an edge of the base surface.

According to an aspect of the invention, there is provided a lithographic apparatus, comprising: a support table as described herein.

According to an aspect of the invention, there is provided a device manufacturing method, comprising using a lithographic apparatus to transfer a pattern from a patterning device to a substrate, wherein the lithographic apparatus comprises a support table configured to support a lower surface of a substrate, wherein the support table comprises: a base surface configured to be substantially parallel to the lower surface of the substrate supported on the support table, a plurality of burls protruding above the base surface, each of the plurality of burls having a respective distal end and a first height above the base surface, the plurality of burls arranged such that, when the substrate is supported by the support table, the substrate is supported by the respective distal end of each of the plurality of the burls, and a plurality of elongate raised protrusions separated by gaps, each of the plurality of elongate raised protrusions having a second height above the base surface, wherein the plurality of elongate raised protrusions protrude above the base surface between the burls, and the second height is less than the first height; wherein the protrusions are arranged such that a plurality of the gaps are aligned to form at least one straight gas flow path towards an edge of the base surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
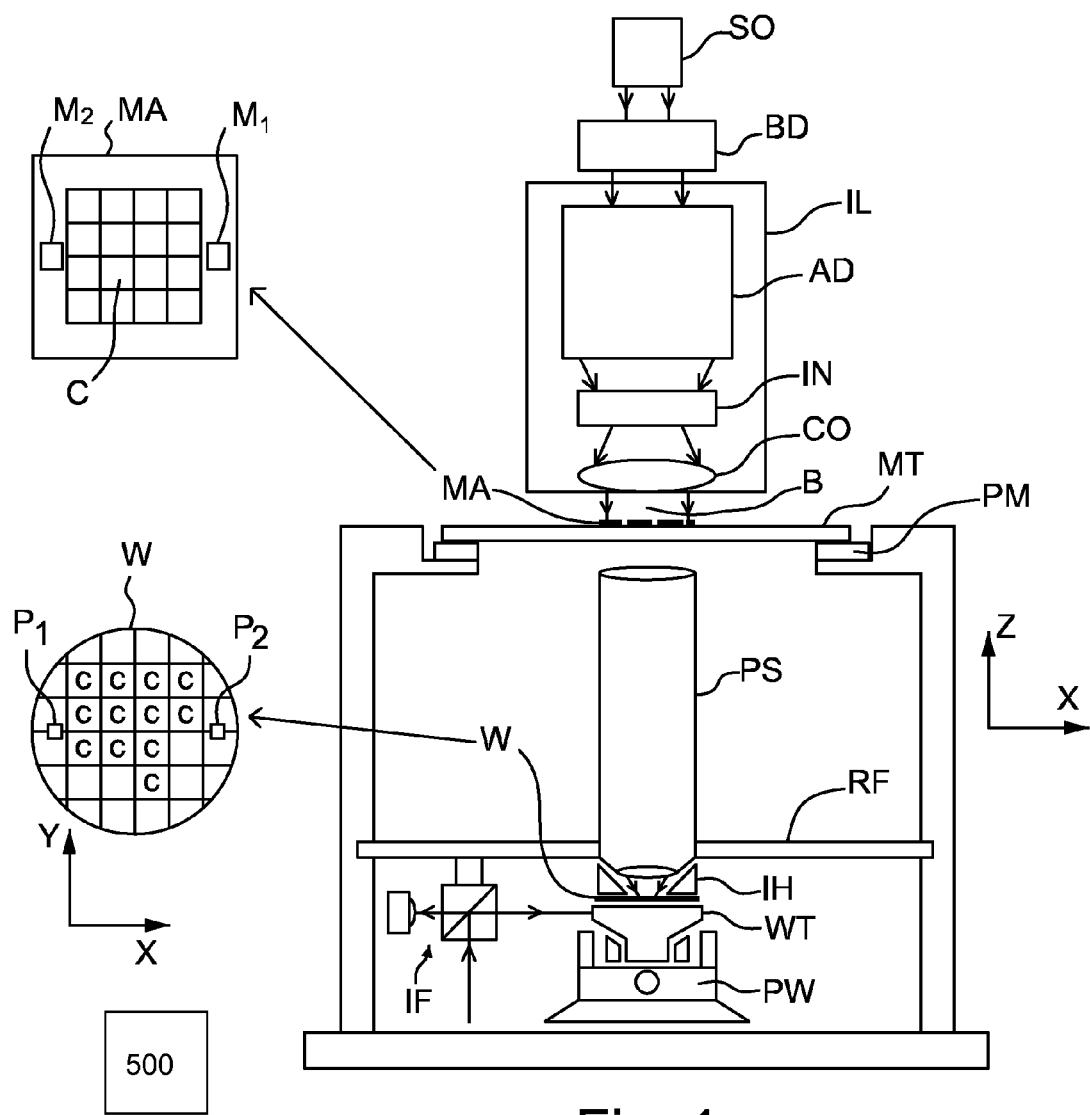
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more cleaning, sensor or measurement tables. For example, in an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In such "multiple stage" (or "multi-stage") machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, cleaning, sensor and/or measurement tables.

In an embodiment, the lithographic apparatus may comprise an encoder system to measure the position, velocity, etc. of a component of the apparatus. In an embodiment, the component comprises a substrate table. In an embodiment, the component comprises a measurement and/or sensor and/or cleaning table. The encoder system may be in addition to or an alternative to the interferometer system described herein for the tables. The encoder system comprises a sensor, transducer or readhead associated, e.g., paired, with a scale or grid. In an embodiment, the movable component (e.g., the substrate table and/or the measurement and/or sensor and/or cleaning table) has one or more scales or grids and a frame of the lithographic apparatus with respect to which the component moves has one or more of sensors, transducers or readheads. The one or more of sensors, transducers or readheads cooperate with the scale(s) or grid(s) to determine the position, velocity, etc. of the component. In an embodiment, a frame of the lithographic apparatus with respect to which a component moves has one or more scales or grids and the movable component (e.g., the substrate table and/or the measurement and/or sensor and/or cleaning table) has one or more of sensors, transducers or readheads that cooperate with the scale(s) or grid(s) to determine the position, velocity, etc. of the component.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-6 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
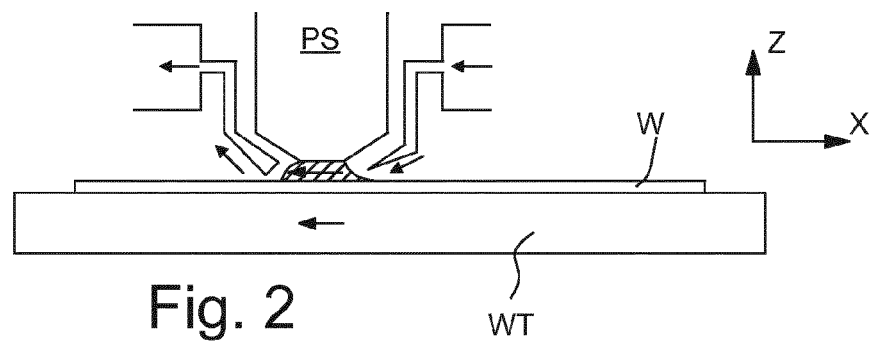
FIGS. 2 and 3 depict a liquid supply system for use in a lithographic projection apparatus.
Figure 3:
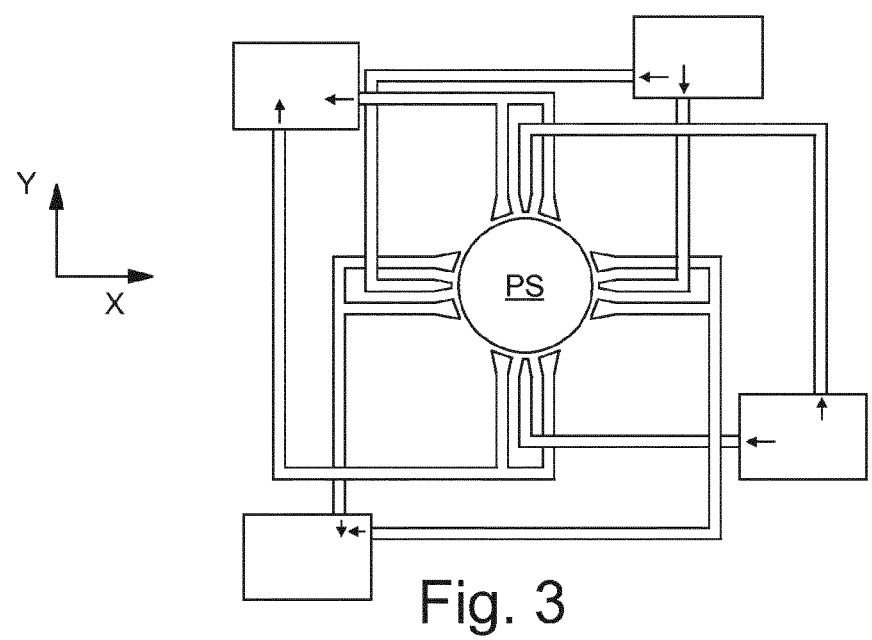

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
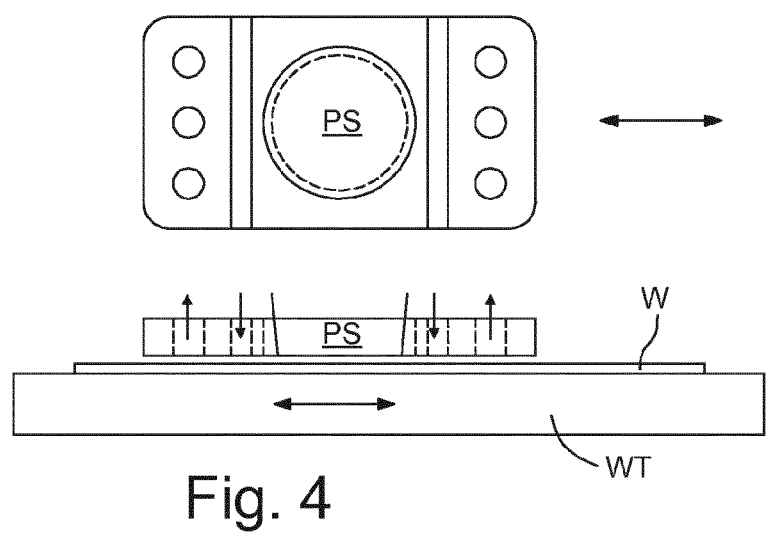
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

In an embodiment, the lithographic apparatus comprises a liquid confinement structure that has a liquid removal device having an inlet covered with a mesh or similar porous material. The mesh or similar porous material provides a two-dimensional array of holes contacting the immersion liquid in a space between the final element of the projection system and a movable table (e.g., the substrate table). In an embodiment, the mesh or similar porous material comprises a honeycomb or other polygonal mesh. In an embodiment, the mesh or similar porous material comprises a metal mesh. In an embodiment, the mesh or similar porous material extends all the way around the image field of the projection system of the lithographic apparatus. In an embodiment, the mesh or similar porous material is located on a bottom surface of the liquid confinement structure and has a surface facing towards the table. In an embodiment, the mesh or similar porous material has at least a portion of its bottom surface generally parallel with a top surface of the table.

Figure 5:
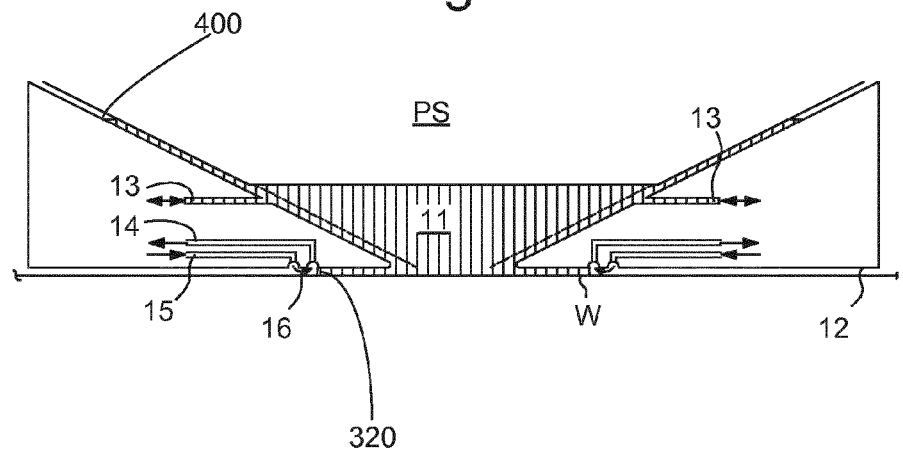
FIG. 5 depicts a further liquid supply system for use in a lithographic projection apparatus.

FIG. 5 schematically depicts a localized liquid supply system or fluid handling structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the fluid handling structure 12 and the surface of the substrate W and may be a contactless seal such as a gas seal (such a system with a gas seal is disclosed in European patent application publication no. EP-A-1,420,298) or liquid seal.

The fluid handling structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the fluid handling structure 12 positioned below and surrounding the final element of the projection system PS. Liquid is brought into the space below the projection system PS and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the fluid handling structure 12 and the surface of the substrate W. The gas seal is formed by gas. The gas in the gas seal is provided under pressure via inlet 15 to the gap between the fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the fluid handling structure 12 does not have a gas seal.

Figure 6:
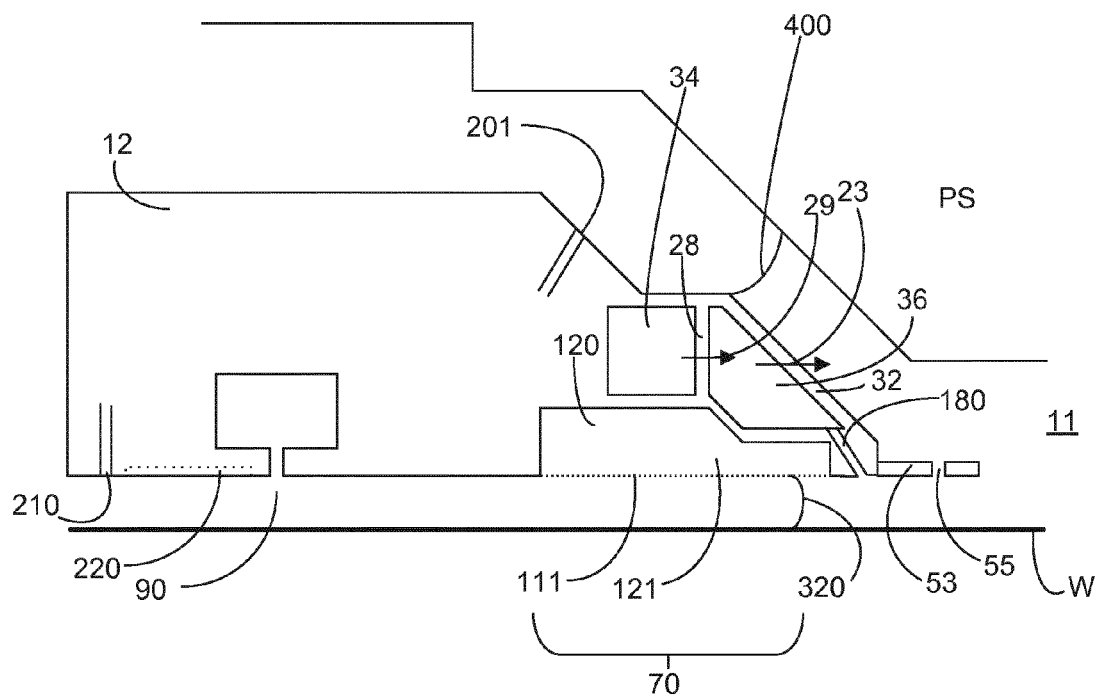
FIG. 6 depicts, in cross-section, a further liquid supply system for use in a lithographic projection apparatus.

FIG. 6 illustrates a fluid handling structure 12 which is part of a liquid supply system. The fluid handling structure 12 extends around the periphery (e.g. circumference) of the final element of the projection system PS.

A plurality of openings 23 in the surface which in part defines the space 11 provides the liquid to the space 11. The liquid passes through openings 29, 23 in side walls 28, 32 respectively through respective chambers 34, 36 prior to entering the space 11.

A seal is provided between the bottom of the fluid handling structure 12 and a facing surface, e.g. the substrate W, or a substrate table WT, or both. In FIG. 6 a seal device is configured to provide a contactless seal and is made up of several components. Radially outwardly from the optical axis of the projection system PS, there is provided a (optional) flow control plate 53 which extends into the space 11. The control plate 53 may have an opening 55 to permit flow liquid therethrough; the opening 55 may be beneficial if the control plate 53 is displaced in the Z direction (e.g., parallel to the optical axis of the projection system PS). Radially outwardly of the flow control plate 53 on the bottom surface of the fluid handling structure 12 facing (e.g., opposite) the facing surface, e.g., the substrate W, may be an opening 180. The opening 180 can provide liquid in a direction towards the facing surface. During imaging this may be useful in preventing bubble formation in the immersion liquid by filling a gap between the substrate W and substrate table WT with liquid.

Radially outwardly of the opening 180 may be an extractor assembly 70 to extract liquid from between the fluid handling structure 12 and the facing surface. The extractor assembly 70 may operate as a single phase or as a dual phase extractor. The extractor assembly 70 acts as a meniscus pinning feature of a meniscus 320 of the liquid.

Radially outwardly of the extractor assembly may be a gas knife 90. An arrangement of the extractor assembly and gas knife is disclosed in detail in United States patent application publication no. US 2006/0158627 incorporated herein in its entirety by reference.

The extractor assembly 70 as a single phase extractor may comprise a liquid removal device, extractor or inlet such as the one disclosed in United States patent application publication no. US 2006-0038968, incorporated herein in its entirety by reference. In an embodiment, the liquid removal device 70 comprises an inlet 120 which is covered in a porous material 111 which is used to separate liquid from gas to enable single-liquid phase liquid extraction. An underpressure in chamber 121 is chosen such that the meniscuses formed in the holes of the porous material 111 prevent ambient gas from being drawn into the chamber 121 of the liquid removal device 70. However, when the surface of the porous material 111 comes into contact with liquid there is no meniscus to restrict flow and the liquid can flow freely into the chamber 121 of the liquid removal device 70.

The porous material 111 has a large number of small holes each with a dimension, e.g. a width, such as a diameter, in the range of 5 to 50 micrometers. The porous material 111 may be maintained at a height in the range of 50 to 300 micrometers above a surface, such as a facing surface, from which liquid is to be removed, e.g. the surface of a substrate W. In an embodiment, porous material 111 is at least slightly liquidphilic, i.e. having a dynamic contact angle of less than 90°, desirably less than 85° or desirably less than 80°, to the immersion liquid, e.g. water.

Radially outward of gas knife 90 may be provided one or more outlets 210 to remove gas from gas knife 90 and/or liquid that may escape past the gas knife 90. The one or more outlets 210 may be located between one or more outlets of the gas knife 90. To facilitate channeling of fluid (gas and/or liquid) to the outlet 210, a recess 220 may be provided in the liquid confinement structure 12 that is directed toward outlet 210 from outlets of the gas knife 90 and/or from between outlets of the gas knife 90.

Although not specifically illustrated in FIG. 6, the liquid supply system has an arrangement to deal with variations in the level of the liquid. This is so that liquid which builds up between the projection system PS and the liquid confinement structure 12 (and forms a meniscus 400) can be dealt with and does not escape. One way of dealing with this liquid is to provide a lyophobic (e.g., hydrophobic) coating. The coating may form a band around the top of the fluid handling structure 12 surrounding the opening and/or around the last optical element of the projection system PS. The coating may be radially outward of the optical axis of the projection system PS. The lyophobic (e.g., hydrophobic) coating helps keep the immersion liquid in the space 11. Additionally or alternatively, one or more outlets 201 may be provided to remove liquid reaching a certain high relative to the structure 12.

Another localized area arrangement is a fluid handling structure which makes use of a gas drag principle. The so-called gas drag principle has been described, for example, in United States patent application publication nos. US 2008-0212046, US 2009-0279060 and US 2009-0279062. In that system the extraction holes are arranged in a shape which may desirably have a corner. The corner may be aligned with a preferred direction of movement, such as the stepping or the scanning direction. This reduces the force on the meniscus between two openings in the surface of the fluid handing structure for a given speed in the preferred direction compared to if the two outlets were aligned perpendicular to the preferred direction. However, an embodiment of the invention may be applied to a fluid handling system which in plan has any shape, or has a component such as the extraction openings arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star.

In a variation of the system of US 2008/0212046 A1, to which an embodiment of the present invention may relate, the geometry of the cornered shape in which the openings are arranged allows sharp corners (between about 60° and 90°, desirably between 75° and 90° and most desirably between 75° and 85°) to be present for the corners aligned both in the scan and in the stepping directions. This allows increased speed in the direction of each aligned corner. This is because the creation of liquid droplets due to an unstable meniscus, for example in exceeding a critical speed, in the scanning direction is reduced. Where corners are aligned with both the scanning and stepping directions, increased speed may be achieved in those directions. Desirably the speed of movement in the scanning and stepping directions may be substantially equal.

Within a lithographic apparatus, a substrate may be supported on a support table. In particular, the support table may be configured to support a lower surface of the substrate. The support table may, for example, include a base surface having a plurality of burls protruding from base surface. The lower surface of the substrate may be supported on the upper faces of the burls. Such an arrangement may minimize or reduce the total area of the substrate in contact with the support table, minimizing or reducing the likelihood of contaminants being transferred between the support table and the substrate and/or minimizing or reducing the likelihood of a contaminant being located between the substrate and its support on the support table, which may result in a deformation of the substrate.

In an embodiment, the space around the burls, below the substrate, may be connected to an under-pressure source. Accordingly, the substrate may be vacuum clamped to the support table.

In the event of a local heat load acting on the substrate and/or the support table, there may be a local temperature variation within, for example, the substrate, resulting in a local thermal expansion or thermal contraction, most significantly in a direction parallel to the upper and lower major faces of the substrate. However, the thermal expansion and/or thermal contraction of the substrate may be resisted by the support table, to which the substrate is clamped. In particular, the forces to resist the thermal expansion and/or thermal contraction may be applied to the substrate via the burls.

In a region towards the center of the substrate, there are burls in every direction around each local part of the substrate. These surrounding burls may provide the forces to resist a thermal expansion and/or thermal contraction. However, in regions around the edge of the substrate, there is only contact with burls in directions towards the center of the substrate. In other words, there are no forces applied to a region of the substrate to resist a thermal expansion and/or thermal contraction from beyond the edge of the substrate.

Consequently, for a given temperature change of a local area of the substrate, the net thermal expansion or contraction of the substrate, namely after taking into account the resistance to expansion or contraction provided by the contact with the burls, will be greater in regions close to the edge of a substrate than in the center of the substrate.

This effect applies not only to thermal expansion and/or contraction caused by a local heat load and/or local temperature change of the substrate but also to a heat load and/or temperature change that applies uniformly across the substrate.

In order to reduce or minimize temperature change within a substrate, a conditioning system may be provided that supplies heat energy to and/or removes heat energy from the support table. Accordingly, heat can be supplied or removed in order to compensate for a heat load on the substrate and/or support table. The conditioning system may provide heat directly to or remove heat directly from the support table to compensate for a heat load on the support table. Furthermore, the conditioning system may provide heat to or remove heat from the support table such that heat flows from the support table to the substrate, or from the substrate to the support table, in order to compensate for a heat load on the substrate.

In an embodiment, the support table, the conditioning system, or both, is configured such that, during use, heat transfer to or from the substrate resulting from the operation of the conditioning system is not uniform across the substrate.

In particular, in an embodiment, the system is configured such that the heat transfer to or from the substrate per unit area of the substrate is greater in one or more regions of the substrate at the edge of the substrate than in one or more regions located at or near the center of the substrate. In other words, the support table and/or conditioning system are configured such that the effect of the conditioning system is greater at the edge region of a substrate than in the central region.

Such a system may be configured such that, for a given heat load, the temperature change of a substrate in its edge region may be less than the temperature change of the substrate in its central region. This may compensate for the variation discussed above in the resulting thermal expansion and/or thermal contraction across a substrate for a given local temperature change. Accordingly, the variation in the resulting expansion and/or contraction of the substrate across the substrate may be reduced or minimized.

Described below are different embodiments that may result in greater heat transfer to or from the substrate per unit area of the substrate in an edge region than the central region of a substrate during operation of the conditioning system.

There may be a gradual change from one or more edge regions, in which the effect of the conditioning system is maximized or increased, to one or more inner regions of a substrate in which the effect of the conditioning system is not as great.

In an embodiment, the support table and/or conditioning system may be configured such that there is a clear distinction between an edge region in which the effect of the conditioning system is greater, and a central region, in which the effect of the conditioning system is relatively reduced.

In either case, the arrangement of the relative locations of the edge and central regions may be selected appropriately in order that the variation in effect of the conditioning system best compensates for the variation in the thermal expansion and/or thermal contraction of a substrate in response to a local temperature change, as discussed above.

A support table according to an embodiment of the present invention may utilize any combination of these aspects.

Figure 7:
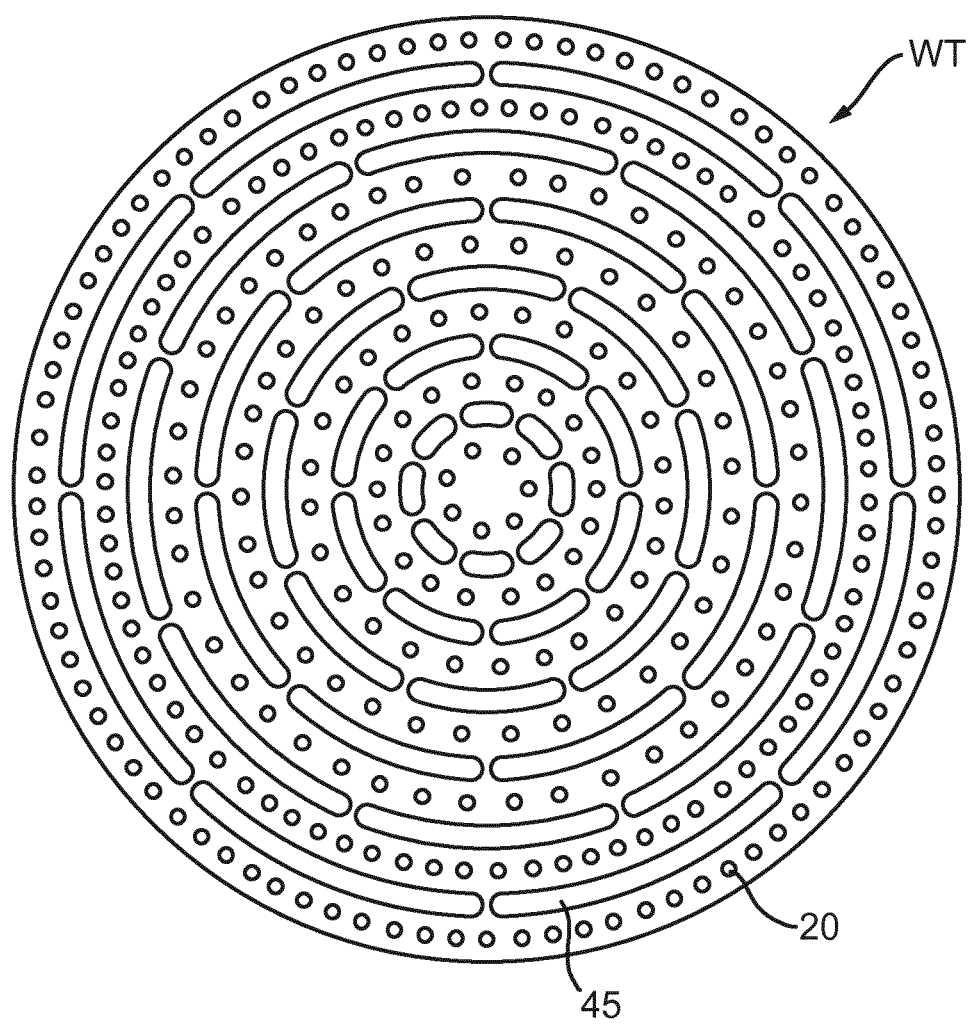
FIG. 7 depicts, in plan, a support table for a lithographic apparatus.

FIG. 7 depicts a support table WT for a lithographic apparatus. The support table WT is configured to support a lower surface of a substrate W.

Figure 10:
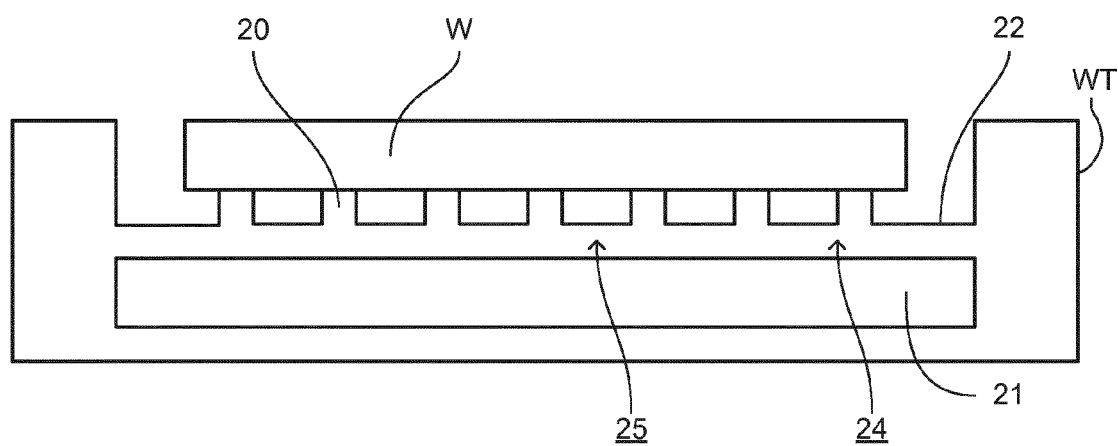
FIG. 10 depicts, in cross-section, a support table according to an embodiment of the invention.

The support table WT comprises a base surface 22 (see FIG. 10). The base surface 22 is configured to be substantially parallel to a lower surface of a substrate W supported on the support table WT. The support table WT comprises a plurality of burls 20. The burls 20 protrude above the base surface 22. Each of the plurality of burls 20 has a respective distal end. Each of the plurality of burls 20 has a first height above the base surface 22. The burls 20 are arranged such that, when a substrate W is supported by the support table WT, the substrate W is supported by the respective distal end of each of the plurality of the burls 20. In an embodiment the substrate W is in contact with only the upper surface of the burls 20.

In use, a substrate W is supported by the support table WT. When a substrate W is supported by the support table WT, the substrate W is supported by the respective distal end of each of the burls 20. The burls 20 are used to hold the substrate W to the support table WT with relatively low contact between the substrate W and the support table WT. For example, in the region of from about 1% to about 3% of the area of the substrate W is in contact with the burls 20 of the support table WT. By having a low amount of contact, contamination sensitivity is reduced.

In use the fluid handling structure 12 puts a thermal load on the substrate W. For example, the thermal load of the fluid handling structure 12 can cool down the substrate W and/or the support table WT.

In an embodiment the support table WT includes a conditioning system 21 (e.g. see FIG. 10). The conditioning system 21 supplies heat energy to and/or removes heat energy from the support table WT (i.e. the part of the support table WT that supports the substrate W). The support table WT can condition the substrate W during exposures so as to reduce deformation of the substrate W due to the thermal load of the fluid handling structure 12. The conditioning system 21 can condition the support table WT itself. In an embodiment the conditioning system 21 supplies heat energy to and/or removes heat energy from the rest of the support table WT. Conditioning the support table WT can reduce deformation of the support table WT. A reduction in deformation of the support table WT can result in a reduction in the deformation of the substrate W.

In an embodiment, the conditioning system 21 may comprise a channel within the support table WT. A conditioning fluid may be provided to flow through the channel. In an embodiment, the conditioning system 21 may include a heater system that can provide heat energy to the support table WT. In an embodiment the conditioning system 21 may be controlled by a controller 500 that may provide improved control of the conditioning system 21. Features of the conditioning system 21 are disclosed in U.S. patent application publication no. 2013/094005, the entire contents of which are herein incorporated by reference.

The thermal load on the substrate W caused by the fluid handing structure 12 can deform the substrate W. For example, the substrate W can shrink. The burls 20 are stiff so as to suppress the deformation of the substrate W. The conditioning system 21 of the support table WT conditions the temperature of the substrate W.

However, due to the limited contact area between the substrate W and the support table WT, the thermal coupling between the substrate W and the support table WT is relatively low. The low thermal coupling can cause the substrate W to undergo greater temperature variation compared to the temperature variation of the support table WT. This is undesirable. In particular, the low amount of contact area between the substrate W and the support table WT restricts the extent to which the temperature of the substrate W can be conditioned by the conditioning system 21 of the support table WT. It would be undesirable to increase the amount of contact between the substrate W and the support table WT because this would increase the contamination sensitivity.

As depicted in FIG. 7, the support table WT comprises a plurality of elongate raised protrusions 45. The elongate raised protrusions 45 are separated by gaps. Each of the plurality of elongate raised protrusions 45 has a second height above the base surface 22. The plurality of elongate raised protrusions 45 protrude above the base surface 22 between the burls 20. The second height is less than the first height. The elongate raised protrusions 45 are configured to form a series of concentric annuli. Each annulus is divided into sections.

By providing the plurality of elongate raised protrusions 45, the gas layer thickness between the substrate W and the support table WT is reduced where the elongate raised protrusions 45 are positioned. This increases the thermal coupling between the substrate W and the support table WT. The tops of the elongate raised protrusions 45 are lower than the tops of the burls 20. The elongate raised protrusions 45 are not in contact with the substrate W. Otherwise the elongate raised protrusions 45 would influence the flatness of the substrate W.

In use, a substrate W is held by the support table WT. In particular, the substrate W may be clamped to the support table WT. The clamping may be assisted by having the region between the substrate W and the support table WT at a lower pressure compared to ambient pressure (i.e. the pressure surrounding the substrate W and the support table WT). The region enclosed by the support table WT and the substrate W may be at near vacuum pressure such that the substrate W is vacuum clamped to the support table WT.

In an embodiment the support table WT comprises one or more holes formed therein. The holes facilitate clamping of the substrate W. Gas may be extracted through the holes from the region enclosed by the substrate W and the support table WT, thereby reducing the pressure in this region for clamping of the substrate W.

The elongate raised protrusions 45 that improve thermal coupling between the substrate W and the support table WT can restrict the flow of gas from below the substrate W towards the holes. This can slow down clamping or loading of the substrate W onto the support table WT. This can reduce the throughput of the lithographic apparatus. The elongate raised protrusions 45 can create a non-uniformity in the vacuum (or near vacuum) below the substrate W. Such a non-uniformity in the vacuum below the substrate W can influence the flatness of the substrate W.

Figure 8:
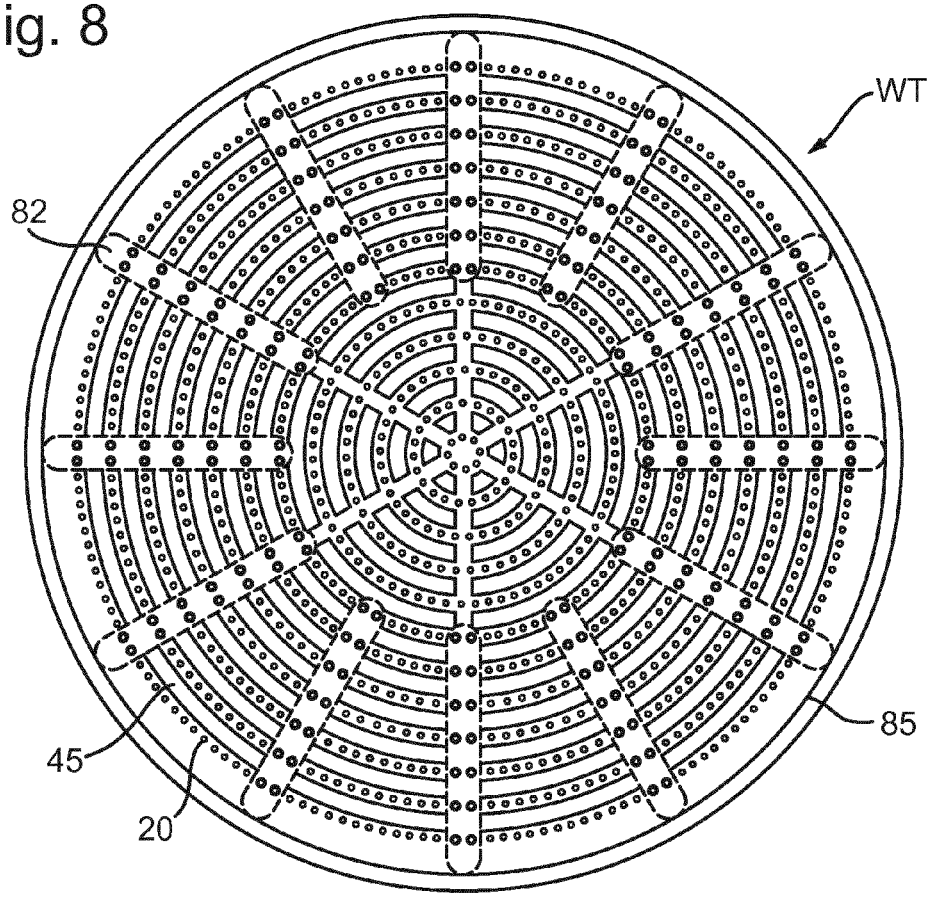
FIG. 8 depicts, in plan, a support table according to an embodiment of the invention.

FIG. 8 depicts in plan a support table WT according to an embodiment of the present invention. The support table WT for a lithographic apparatus is configured to support a lower surface of a substrate W.

The support table WT comprises a base surface 22 (see FIG. 10) configured to be substantially parallel to a lower surface of a substrate W supported on the support table WT. The support table WT comprises a plurality of burls 20 protruding above (e.g., from) the base surface 22. Each of the plurality of burls 20 has a respective distal end. Each of the plurality of burls 20 has a first height above the base surface 22. The plurality of burls 20 are arranged such that, when a substrate W is supported by the support table WT, the substrate W is supported by the respective distal end of each of the plurality of burls 20. In an embodiment the substrate W is in contact with only the burls 20.

The support table WT comprises a plurality of elongate raised protrusions 45 separated by gaps. Each of the plurality of elongate raised protrusions 45 has a second height above the base surface 22. The plurality of elongate raised protrusions protrude above (e.g. from) the base surface 22 between the burls 20. The second height is less than the first height. In an embodiment the elongate raised protrusions 45 are arranged such that a plurality of the gaps (that separate the elongate raised protrusions 45) are aligned to form at least one straight gas flow path 82 towards an edge of the base surface 22. In an embodiment the elongate raised protrusions 45 are configured to form one or more shapes each divided by the gaps into the elongate raised protrusions 45. In an embodiment the elongate raised protrusions 45 have the form of mesas. However, the elongate raised protrusions 45 do not necessarily need to have the form of mesas.

In an embodiment, the elongate raised protrusions 45 may be configured such that their upper surfaces substantially form a series of annuli (e.g., a series of concentric rings) extending around an outer region 24 (see FIG. 11) of the support table WT. Each annulus is divided into a plurality of sections (i.e. each section corresponds to one of the elongate raised protrusions 45 that form the annulus). This provides a plurality of gaps between the elongate raised protrusions 45 to help ensure easier flow of gas between the region of the base surface 22 radially inward of the annulus and the region of the base surface 22 radially outward of the annulus. The gaps between the elongate raised protrusions 45 may reduce local reductions in the under pressure used for vacuum clamping a substrate W to the support table WT.

As is discussed further below, in an embodiment, the elongate raised protrusions 45 may be distributed over the entire support table WT, namely in both the outer region 24 and the inner region 25 (see FIG. 11). In such an arrangement, the elongate raised protrusions 45 may be configured as a series of concentric rings, which may each have a plurality of gaps as discussed above. In such an arrangement, adjacent concentric rings of elongate raised protrusions 45 may be arranged between the burls 20. Provision of such an arrangement may facilitate manufacture of the support table WT.

In FIG. 8, the shapes are depicted as annuli. However, other shapes are possible, for example, a square, a rectangle or a star-shape. In particular, the shape may be chosen to correspond to the shape of the substrate W and/or the support table WT. For example, in the case that the substrate W and/or the support table WT has a square shape, the shape formed by the plurality of elongate raised protrusions 45 may be a square.

In an embodiment the elongate raised protrusions 45 are arranged to form substantially concentric shapes. Each shape is formed of a plurality of elongate raised protrusions 45 separated by the gaps. In an embodiment the concentric shapes form a series of concentric shapes. The sequential shapes surround each other. For example, in an embodiment the plurality of elongate raised protrusions 45 form two (first and second) shapes, wherein the first shape is surrounded by the second shape. In an embodiment the plurality of elongate raised protrusions 45 are arranged to form three substantially concentric shapes. In this case the third shape surrounds the second shape (and hence also the first shape). In an embodiment the plurality of elongate raised protrusions 45 are arranged to form more than three substantially concentric shapes. In this case each sequential shape surrounds the preceding shapes in the series, in the manner described above for the case where there are three shapes. In an embodiment the shapes may not be substantially concentric.

The shapes are divided by gaps into the elongate raised protrusions 45. In an embodiment the plurality of elongate raised protrusions 45 are arranged such that a plurality of the gaps are aligned to form at least one straight gas flow path 82 towards an edge of the base surface 22.

By providing that the gaps are aligned to form at least one straight gas flow path 82 towards an edge of the base surface 22, the loss of time in vacuum clamping due to the elongate raised protrusions 45 can be compensated. The straight gas flow paths 82 provide a clearer channel along which gas can flow. The straight gas flow paths 82 reduce the restriction to gas flow caused by the elongate raised protrusions 45. The straight gas flow paths 82 speed up and improve clamping of the substrate W.

In an embodiment the floor of the straight gas flow paths 82 is lower than the base surface 22 such that the at least one straight gas flow path 82 forms a groove in the base surface 22. Deeper grooves provide more space and less restriction for gas flow. Gas flow can be increased, thereby improving clamping of the substrate W.

In an embodiment the floor of the straight gas flow paths 82 is at substantially the same level as the base surface 22. By providing the straight gas flow paths 82 and the base surface 22 at substantially the same level, manufacturability of the support table WT is improved.

In an embodiment the elongate raised protrusions 45 are arranged to form a plurality of shapes, thereby further increasing the thermal coupling between the substrate W and the support table WT. The increased thermal coupling increases the extent to which the conditioning system 21 of the support table WT can condition the temperature of the substrate W. This helps to reduce deformation of the substrate W due to the thermal load of the fluid handling structure 12.

In an embodiment the shapes are substantially concentric. By providing the shapes as being substantially concentric, manufacturability of the support table WT is improved.

As mentioned above, in an embodiment the support table WT comprises a hole formed therein. In an embodiment the at least one straight gas flow path 82 is in a region radially outward of the hole. At least some of the elongate raised protrusions 45 are radially outward of the hole, thereby restricting gas flow between the hole and the edge of the base surface 22. The straight gas flow paths 82 between the elongate raised protrusions 45 improve gas flow between the hole and the edge of the base surface 22.

In an embodiment, all of the floor of the straight gas flow paths 82 is at substantially the same distance below the base surface 22.

By providing the straight gas flow paths 82, gas flow below the substrate W is increased. During loading of the substrate W, gas is extracted through the hole. The speed of gas flow within the straight gas flow paths 82 is greater compared to the gas flow in other regions of the support table WT.

In an embodiment the at least one straight gas flow path 82 is substantially radial with respect to a center of the base surface 22. This is depicted in FIG. 8. By providing that each straight gas flow path 82 extends substantially radially, gas flow between the hole and the edge of the base surface 22 in particular is increased. It is not necessary for each straight gas flow path 82 to extend exactly in the radial direction. For example, straight gas flow paths 82 may extend in a direction that is angled relative to the radial direction. In an embodiment one or more straight gas flow paths may extend substantially tangentially.

In an embodiment each straight gas flow path 82 forms a substantially straight line. However, in an embodiment gas flow paths may be bent or curved. For example, part of a bent gas flow path may extend in the radial direction. Another part of a bent gas flow path may be angled with respect to the radial direction.

In an embodiment the at least one straight gas flow path 82 extends at least in a region radially outward of the hole. By providing that the straight gas flow paths 82 are in a region radially outward of the hole, the gas flow in the region radially outward of the outlet holes is increased. In particular, gas flow in the region between the hole and the edge of the base surface 22 is increased. This is particularly helpful because it is in this region where the gas flow is otherwise particularly low. Increased gas flow at the edge of the support table WT is particularly advantageous because most of the gas extraction is at the edge of the support table WT. During the process of loading the substrate W, the substrate W makes contact with the support table WT first in the central region of the base surface 22. Hence, more gas flows (e.g. is sucked) from the peripheral region of the base surface 22 compared to the central region of the base surface 22.

In an embodiment the straight gas flow paths 82 are provided toward the edge of the support table WT. For example the straight gas flow paths 82 may extend at least in a region radially outward of the one or more holes. In an embodiment the pressure is substantially uniform across the support table WT. Such uniformity of pressure improves the flatness of the substrate W. There is a need for greater gas flow in the region toward the edge of the support table WT so as to hold the substrate W. The clamping force propagates from the center towards the edge. Having straight gas flow paths 82 toward the edge of the support table WT can help to draw in ambient gas while reducing or minimizing any pressure drop.

However, it is not necessary that the straight gas flow paths 82 are in the region radially outward of the one or more holes. In an embodiment the straight gas flow paths 82 may be in a region radially inward of the holes. In this case, the straight gas flow paths 82 increase gas flow in the region radially inward of the holes. This increases the speed of clamping the substrate W, thereby increasing throughput of the lithographic apparatus. In an embodiment the straight gas flow paths 82 may extend both inward and outward relative to the holes. In an embodiment the plurality of gaps are aligned to form the at least one straight gas flow path 82 from a center of the base surface 22 towards the edge of the base surface 22. In an embodiment the straight gas flow paths 82 may extend all the way to the center of the base surface 22.

In an embodiment the straight gas flow paths 82 extend radially between the holes. The gas flow when loading the substrate W can be particularly low in the regions that are between the holes and radially outward of the holes. By providing the straight gas flow paths 82 between the holes, the gas flow is increased in this region, thereby having a particularly large effect on the speed of clamping of the substrate W.

In an embodiment the hole is located within the at least one straight gas flow path 82. The hole may be in the line of the straight gas flow paths 82. In an embodiment the straight gas flow paths 82 may extend radially outwards from the holes towards the edge of the support table WT. In an embodiment each hole is located at one end of a corresponding straight gas flow path 82. In an embodiment each hole is located at a radially inward end of a corresponding straight gas flow path 82. Such straight gas flow paths 82 have an advantage of increasing the gas flow in the region between the substrate W and the support table WT where the under pressure connected to the outlet hole can have greatest effect. The straight gas flow path 82 is a channel leading directly to the hole such that gas flow is greatly increased, thereby speeding up clamping of the substrate W.

In an embodiment there may be only straight gas flow paths 82 that extend radially between the holes (i.e. without any holes located within a straight gas flow path 82). In an embodiment there may be only straight gas flow paths 82 which have a hole located within them (i.e. without any straight gas flow paths 82 that extend radially between the holes). In an embodiment there may be both straight gas flow paths 82 that extend radially between the holes and straight gas flow paths 82 that include holes.

Figure 9:
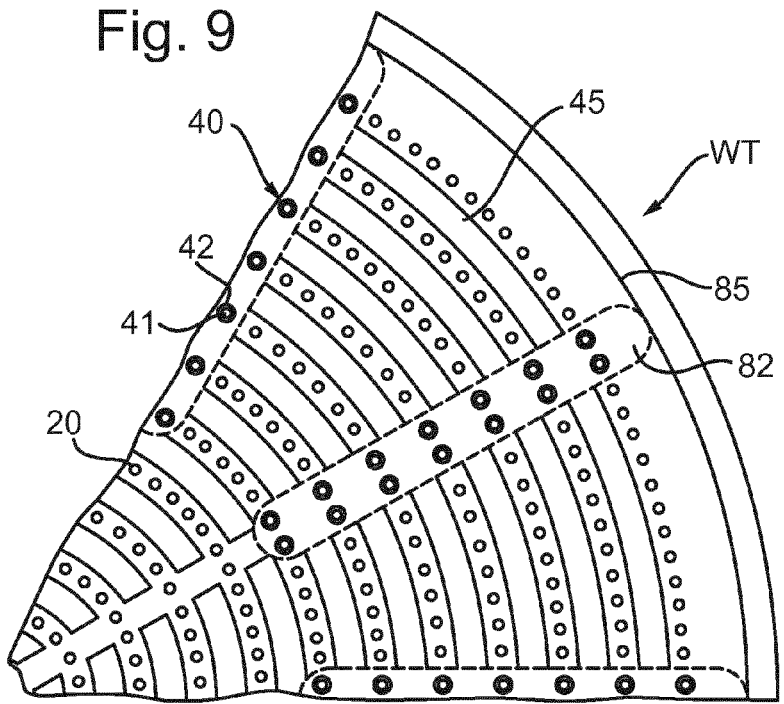
FIG. 9 depicts, in plan, an enlarged view of a section of the support table of FIG. 8.

FIG. 9 depicts an enlarged view of a section of a support table WT according to an embodiment of the invention, in plan. In an embodiment the support table WT further comprises a plurality of further burls 40 protruding from a floor of the at least one straight gas flow path 82. The further burls 40 are arranged such that, when a substrate W is supported by the support table WT, the substrate W is supported by a respective distal end of each of the plurality of further burls 40. By providing the further burls 40 within the straight gas flow paths 82, flatness of the substrate W supported by the support table WT is increased. By providing the further burls 40 within the straight gas flow paths 82, the maximum distance between burls 20 and/or further burls 40 that support the substrate W is decreased, thereby decreasing the possibility of the substrate W sagging or bowing in between the burls 20 and/or further burls 40.

However, in an embodiment further burls are not provided within the straight gas flow paths 82. In this case, the straight gas flow paths 82 are used to increase gas flow by a greater extent. The gas flow is not disturbed by the further burls 40.

In an embodiment each of the further burls 40 within the straight gas flow paths 82 is a stepped burl, i.e. has a stepped profile in cross-section in a plane perpendicular to the base surface 22. The stepped profile has a first portion 41 that has a third height and a respective distal end so as to support the lower surface of the substrate W. In an embodiment the first height is substantially equal to the third height. The stepped profile further has a second portion 42 that surrounds the first portion 41. The second portion 42 protrudes from the floor of the at least one straight gas flow path 82. The second portion has a fourth height above the base surface 22. The fourth height is less than the third height. Provided that it is sufficiently large, the second portion 42 increases thermal coupling between the substrate W and the support table WT. In an embodiment the second height is substantially equal to the fourth height such that upper surface of the second portion 42 is substantially parallel with the upper surface of the elongate raised protrusions 45 for improving thermal coupling. The further burls 40 are beneficial in terms of manufacturability.

The further burls 40 have a first portion 41 that is arranged to be in contact with the lower surface of the substrate W and may correspond to the non-stepped burls 20. The further burls 40 further include a second portion 42 that does not contact the lower surface of the substrate W. Accordingly, each of the second portions 42 of the further burls 40 provides an area in which the separation between the support table WT and the lower surface of the substrate W is reduced but does not affect the total area of burls 20 per unit area of the lower surface of the substrate W that is in contact with the substrate W.

The second portion 42 of each of the further burls 40 may surround the first portion 41. The size of the second portions 42 need not be the same for all of the further burls 40. Accordingly, for example, the width and/or height of the second portions 42 of the further burls 40 may increase with distance from the center of the base surface 22 such that the resistance to thermal transfer between the support table WT and the substrate W decreases towards the edge of the substrate W. The undesirable effects of temperature changes of the substrate W may be greater at the edge of the substrate W. However, decreased resistance to thermal transfer between the support table WT and the substrate W towards the edge of the substrate W allows for better conditioning to be applied to the edge of the substrate W. Better conditioning at the edge of the substrate W better reduces temperature changes at the edge of the substrate W relative to those in the center, thereby compensating for the greater impact of temperature changes at the edge of the substrate W.

It is not necessary for the further burls 40 within the straight gas flow paths 82 to have a stepped profile. The second portion 42 of the further burls 40 may be omitted, thereby increasing the space in the straight gas flow paths 82. The increased space in the straight gas flow paths 82 may have the effect of increasing gas flow through the straight gas flow paths 82.

In an embodiment the support table WT comprises a plurality of holes at a distance from a center of the base surface 22. The support table WT may have a radius with an array of holes that facilitates clamping of the substrate W. However, it is not necessary for there to be an array of holes. In an embodiment, there may be only a single hole. In an embodiment there may be a plurality of holes at different distances from the center of the base surface 22.

Any lowering of the floor of the straight gas flow paths 82 relative to the base surface 22 would further improve gas flow, thereby further speeding up clamping of the substrate W and throughput of the lithographic apparatus. In an embodiment the floor is at least as far lower than the base surface 22 as the burls 20 protrude above the base surface 22 such that the at least one straight gas flow path 82 forms a groove in the base surface 22. In this case, the distance between the substrate W and the bottom surface 22 of the straight gas flow paths 82 is at least twice the distance between the lower surface of the substrate W and the base surface 22. This facilitates fast gas transport from the edge of the base surface 22 to the center of the base surface 22.

As depicted in FIG. 8, in an embodiment, the gaps between the elongate raised protrusions 45 of sequential shapes are aligned in a substantially radial direction. In an embodiment each shape encompasses a center of the base surface 22. For example, in an embodiment each shape is centered with respect to the base surface 22.

In an embodiment the support table WT further comprises a ring-shaped seal 85. The ring-shaped seal 85 protrudes from the base surface 22. The ring-shaped seal 85 surrounds the burls 20. The ring-shaped seal 85 is between the support table WT and the substrate W. The ring-shaped seal 85, together with backfill gas, can help to control the temperature of the substrate W.

Further optional features of the support table WT are disclosed in U.S. patent application publication no. 2013/094005, the entire contents of which are herein incorporated by reference.

FIG. 10 schematically depicts a support table WT in which an embodiment of the invention may be provided. The embodiment depicted in FIG. 10 is simplified and features of a support table WT not required to explain an embodiment of the present invention are not depicted. Nevertheless, a support table WT of an embodiment of the present invention may include many such additional features.

As shown, the support table WT may further comprise a conditioning system 21 configured to supply heat energy to and/or remove heat energy from the support table WT.

The substrate W is thermally coupled to the support section 22, for example by means of heat conduction through the burls 20 that are in physical contact with the lower surface of the substrate W. In other words, when the conditioning system 21 supplies heat energy to, or removes heat energy from, the support table WT, energy in turn transfers from the support table WT to the substrate W or to the support table WT from the substrate W, respectively.

As discussed below, the support table WT and/or the conditioning system 21 are configured such that, during operation, heat transfer to or from the substrate W per unit area of the substrate W is greater in a first, outer region of the substrate W, namely one that is adjacent to the edge of the substrate W, than it is in a second, inner region of the substrate. For convenience of description, it will be appreciated that the support table WT includes an outer region 24 that is adjacent to, and thermally coupled to, the outer region of the substrate W. The support section further includes an inner region 25 that is adjacent to, and thermally coupled to, the inner region of the substrate W.

Figure 11:
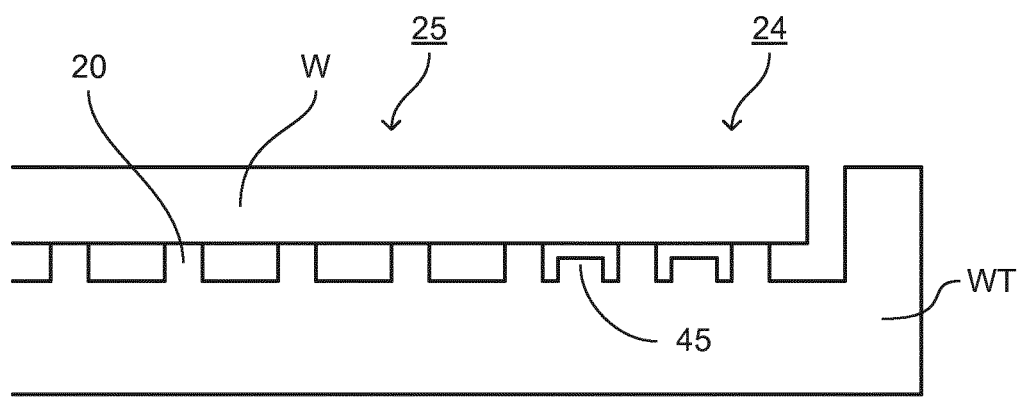
FIGS. 11 and 12 each depict, in cross-section, details of support tables according to an embodiment of the invention.

As depicted in FIG. 11, the support table WT may include one or more elongate raised protrusions 45 provided between the burls 20. The elongate raised protrusions 45 may be arranged such that they do not adjoin any of the burls 20. This may facilitate manufacturing the support table WT. However, by providing local areas within the outer region 24 in which the separation between the uppermost surface of the support table WT and the lower surface of the substrate W is reduced, the resistance to transferring heat energy between the support table WT and the substrate W through the gas gap may be reduced. In turn, the resistance to transfer of heat energy between the support table WT and the substrate W may be lower in the outer region 24 than in the inner region 25.

In an embodiment, the elongate raised protrusions 45 are arranged to form annuli. In an embodiment each annulus is formed from a plurality of elongate raised protrusions 45 separated by the gaps. In an embodiment each annulus extends around the outer region 24 of the support table WT, namely encompassing the inner region 25. This may facilitate manufacture.

In an embodiment, at least one elongate raised protrusion 45 may be configured such that the separation between the upper surface of the elongate raised protrusion 45 and the lower surface of a substrate W supported by the support table WT is 10 μm or less. In such an embodiment, the separation of the base surface 22 from the lower surface of the substrate W may be 150 μm. Alternatively, the separation between the base surface 22 and the lower surface of the substrate W may be larger, for example 400 μm or more. In an embodiment having a plurality of elongate raised protrusions 45, approximately 50% of the area of the lower surface of a substrate W may be directly above an elongate raised protrusion 45. Accordingly, the thermal conductivity between the support table WT and the substrate W may be improved. In particular, the thermal transfer may be increased by a factor of approximately 2 to 3, all other factors remaining constant.

Figure 12:
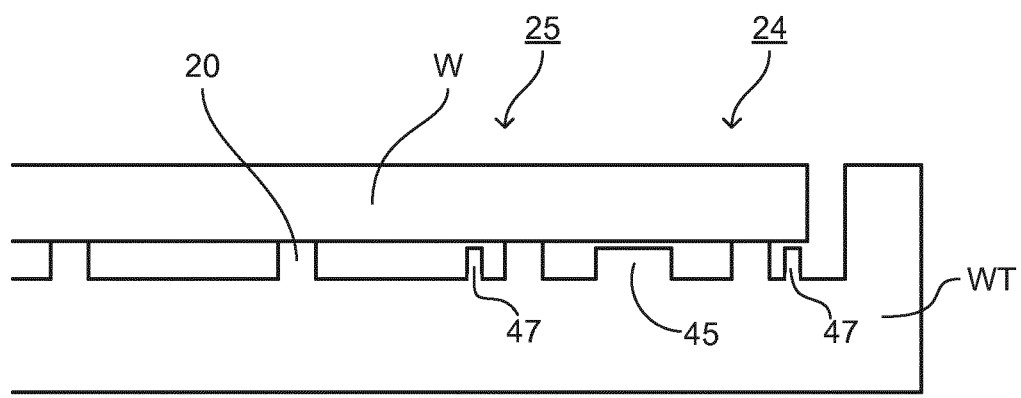

In an embodiment, as depicted in FIG. 12, the position and size of the elongate raised protrusions 45 may be selected such that, during use of the support table WT in an immersion lithographic apparatus, a thin layer of immersion fluid is arranged between the upper surface of the elongate raised protrusions 45 and the lower surface of the substrate W.

This thin layer of immersion fluid may significantly reduce the resistance to heat transfer between the support table WT and the substrate W without providing a physical restraint on the substrate W such as would be the case if the elongate raised protrusions 45 were in physical contact directly with the substrate W.

In an embodiment, one or more of the elongate raised protrusions 45 may be located between two seals 47 that are arranged to prevent or limit the transfer of immersion fluid under the substrate W from the edge of the substrate W towards the center of the substrate W. The two seals 47 may be formed from annular elongate raised protrusions that extend to a position sufficiently close to the underside of the substrate W as to provide the desired sealing functionality. In an embodiment, the elongate raised protrusion are arranged to form a shape that is not annular so as to help ensure that the pressure in the region between the two seals 47 is uniform. For example the shape may be arranged in a peripheral (e.g., circumferential) path that has one or more of the gaps between the elongate raised protrusions 45 to connect the region between the innermost seal 47 and the elongate raised protrusions 45 to the region between the outermost seal 47 and the elongate raised protrusions 45. In this location, for example, during use, immersion fluid may be drawn towards the elongate raised protrusion 45 by the under pressure provided around the burls 20 that is used to vacuum clamp the substrate W to the support table WT. The height of the elongate raised protrusions 45 relative to the lower surface of the substrate W may be selected such that the gap between the top of the elongate raised protrusions 45 and the lower surface of the substrate W is such that the immersion fluid is retained in the gap. In particular, the size of the gap may be selected such that the capillary pressure holding the immersion fluid in the gap is greater than the difference in gas pressure across the elongate raised protrusions 45 that may be caused by the under pressure used to vacuum clamp the substrate W to the support table WT.

In an embodiment, a fluid other than a fluid that has been provided for the performance of immersion lithography may be provided to the elongate raised protrusions 45. Accordingly, a supply of an appropriately selected fluid may be provided to the elongate raised protrusions 45.

As will be appreciated, any of the above described features can be used with any other feature and it is not only those combinations explicitly described which are covered in this application. For example, an embodiment of the invention could be applied to the embodiments of FIGS. 2 to 4. Furthermore, discussions herein of heating or heaters should be understood to encompass cooling or coolers, respectively.

Furthermore, although embodiments of the invention have been described above in the context of an immersion lithographic apparatus for convenience, it will be appreciated that an embodiment of the invention may be used in conjunction with any form of lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according to the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A support table for a lithographic apparatus, the support table configured to support a lower surface of a substrate, wherein the support table comprises:
 a base surface configured to be substantially parallel to the lower surface of the substrate supported on the support table,
 a plurality of burls protruding above the base surface, each of the plurality of burls having a respective distal end and a first height above the base surface, the plurality of burls arranged such that, when the substrate is supported by the support table, the substrate is supported by the respective distal end of each of the plurality of the burls, and
 a plurality of elongate raised protrusions separated by gaps among the protrusions, each of the plurality of elongate raised protrusions having a second height above the base surface, wherein the plurality of elongate raised protrusions protrude above the base surface between the burls, and the second height is less than the first height;
 wherein the protrusions are arranged such that a plurality of the gaps are aligned to form a straight gas flow path from a central region of the base surface towards an edge of the base surface.

2. The support table of claim 1, further comprising a plurality of further burls protruding from a floor of the straight gas flow path.

3. The support table of claim 2, wherein each of the further burls has a stepped profile in cross-section in a plane perpendicular to the base surface, wherein the stepped profile has a first portion that has a third height and a respective distal end so as to support the lower surface of the substrate and a second portion that surrounds the first portion and protrudes from the floor, and the second portion has a fourth height above the base surface less than the third height.

4. The support table of claim 2, wherein the floor is lower than the base surface such that the straight gas flow path forms a groove in the base surface.

5. The support table of claim 1, wherein the straight gas flow path is substantially radial with respect to a center of the base surface.

6. The support table of claim 1, wherein the support table comprises a hole formed therein, wherein the straight gas flow path is in a region radially outward of the hole.

7. The support table of claim 6, wherein the hole is located within the straight gas flow path.

8. The support table of claim 2, wherein the floor is at least as far lower than the base surface as the burls protrude above the base surface such that the straight gas flow path forms a groove in the base surface.

9. The support table of claim 1, wherein the elongate raised protrusions are arranged to form substantially concentric shapes, wherein each shape is formed from a plurality of the elongate raised protrusions separated by the gaps.

10. The support table of claim 1, wherein the elongate raised protrusions are arranged to form annuli, wherein each annulus is formed from a plurality of the protrusions separated by the gaps.

11. The support table of claim 1, further comprising a ring-shaped seal protruding from the base surface surrounding the burls.

12. The support table of claim 1, further comprising a conditioning system configured to supply heat energy to and/or remove heat energy from the support table.

13. A lithographic apparatus, comprising:
 a support table, the support table configured to support a lower surface of a substrate, wherein the support table comprises:
 a base surface configured to be substantially parallel to the lower surface of the substrate supported on the support table,
 a plurality of burls protruding above the base surface, each of the plurality of burls having a respective distal end and a first height above the base surface, the plurality of burls arranged such that, when the substrate is supported by the support table, the substrate is supported by the respective distal end of each of the plurality of the burls, and a plurality of elongate raised protrusions separated by gaps among the protrusions, each of the plurality of elongate raised protrusions having a second height above the base surface, wherein the plurality of elongate raised protrusions protrude above the base surface between the burls, and the second height is less than the first height, wherein the protrusions are arranged such that a plurality of the gaps are aligned to form a straight gas flow path from a central region of the base surface towards an edge of the base surface; and a pattern transfer apparatus configured to transfer a pattern to the substrate.

14. A device manufacturing method, comprising using a lithographic apparatus to transfer a pattern from a patterning device to a substrate, wherein the lithographic apparatus comprises a support table configured to support a lower surface of the substrate, wherein the support table comprises;

a base surface configured to be substantially parallel to the lower surface of the substrate supported on the support table, a plurality of burls protruding above the base surface, each of the plurality of burls having a respective distal end and a first height above the base surface, the plurality of burls arranged such that, when the substrate is supported by the support table, the substrate is supported by the respective distal end of each of the plurality of the burls, and a plurality of elongate raised protrusions separated by gaps among the protrusions, each of the plurality of elongate raised protrusions having a second height above the base surface, wherein the plurality of elongate raised protrusions protrude above the base surface between the burls, and the second height is less than the first height;

wherein the protrusions are arranged such that a plurality of the gaps are aligned to form a straight gas flow path from a central region of the base surface towards an edge of the base surface.

15. The apparatus of claim 13, further comprising a plurality of further burls protruding from a floor of the straight gas flow path.

16. The apparatus of claim 13, wherein the support table comprises a hole formed therein, wherein the straight gas flow path is in a region radially outward of the hole.

17. The apparatus of claim 13, wherein the elongate raised protrusions are arranged to form annuli, wherein each annulus is formed from a plurality of the protrusions separated by the gaps.

18. The apparatus of claim 13, further comprising a ring-shaped seal protruding from the base surface surrounding the burls.

19. The support table of claim 1, wherein the protrusions are arranged such that at least three adjacent gaps are aligned to form the straight gas flow path towards the edge of the base surface.

20. The apparatus of claim 13, wherein the protrusions are arranged such that at least three adjacent gaps are aligned to form the straight gas flow path towards the edge of the base surface.

* * * * *